(12) United States Patent
Ito

(10) Patent No.: US 11,047,927 B2
(45) Date of Patent: Jun. 29, 2021

(54) DISPLACEMENT DETECTOR DEVICE

(71) Applicant: Murata Manufacturing Co., Ltd., Nagaokakyo (JP)

(72) Inventor: Yoshihiro Ito, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 12 days.

(21) Appl. No.: 16/796,971

(22) Filed: Feb. 21, 2020

(65) Prior Publication Data

US 2020/0191882 A1 Jun. 18, 2020

Related U.S. Application Data

(63) Continuation of application No. PCT/JP2018/030842, filed on Aug. 21, 2018.

(30) Foreign Application Priority Data

Sep. 6, 2017 (JP) .............................. JP2017-171064

(51) Int. Cl.
*G01R 33/00* (2006.01)
*G01R 33/06* (2006.01)

(52) U.S. Cl.
CPC ......... *G01R 33/0005* (2013.01); *G01R 33/06* (2013.01)

(58) Field of Classification Search
CPC ... G01D 5/145; G01R 33/0082; G01R 33/091
See application file for complete search history.

(56) References Cited

U.S. PATENT DOCUMENTS

| 2002/0005715 A1 | 1/2002 | Sato |
| 2009/0177436 A1 | 7/2009 | Yoshida et al. |
| 2010/0145657 A1 | 6/2010 | Kavusi et al. |

(Continued)

FOREIGN PATENT DOCUMENTS

| JP | 63-275902 A | 11/1988 |
| JP | 2002-022403 A | 1/2002 |

(Continued)

OTHER PUBLICATIONS

Official Communication issued in International Patent Application No. PCT/JP2018/030842, dated Oct. 30, 2018.

(Continued)

*Primary Examiner* — Alvaro E Fortich
(74) *Attorney, Agent, or Firm* — Keating & Bennett, LLP

(57) ABSTRACT

In multiple magnetic sensors, for a correlation function between a magnetic field applied from a magnet and a value of the magnetic field detected by the magnetic sensor at a first temperature, the value detected by the magnetic sensor when the magnetic field applied from the magnet is 0 is set to be a first offset value. For a correlation function between a magnetic field applied from the magnet and a value of the magnetic field detected by the magnetic sensor at a second temperature, the value detected by the magnetic sensor when the magnetic field applied from the magnet is 0 is set to be a second offset value. The second temperature is higher than the first temperature. A values of applied magnetic fields detected by first and second magnetic sensors are opposite in polarity.

17 Claims, 9 Drawing Sheets

(56) References Cited

U.S. PATENT DOCUMENTS

| | | | | |
|---|---|---|---|---|
| 2013/0328825 A1* | 12/2013 | Brown | ............... | G06F 3/04886 |
| | | | | 345/174 |
| 2013/0328914 A1* | 12/2013 | Smith | ................... | G06F 1/1613 |
| | | | | 345/619 |
| 2015/0084619 A1* | 3/2015 | Stark | ...................... | G01B 7/004 |
| | | | | 324/207.2 |
| 2017/0074715 A1 | 3/2017 | Bartos et al. | | |
| 2017/0254672 A1* | 9/2017 | Voss | ...................... | G01D 5/145 |
| 2018/0058905 A1 | 3/2018 | Zhang | | |

FOREIGN PATENT DOCUMENTS

| | | | |
|---|---|---|---|
| JP | 2002-277308 | A | 9/2002 |
| JP | 2010-156686 | A | 7/2010 |
| JP | 2012-042259 | A | 3/2012 |
| JP | 2012-189613 | A | 10/2012 |
| JP | 2012-220194 | A | 11/2012 |
| JP | 2014-145714 | A | 8/2014 |
| JP | 2015-121424 | A | 7/2015 |
| TW | 201706575 | A | 2/2017 |
| WO | 2016/163171 | A1 | 10/2016 |

OTHER PUBLICATIONS

Official Communication issued in corresponding Chinese Patent Application No. 201880057124.X, dated Apr. 20, 2021.

\* cited by examiner

DISPLACEMENT DETECTOR DEVICE

CROSS REFERENCE TO RELATED APPLICATIONS

This application claims the benefit of priority to Japanese Patent Application No. 2017-171064 filed on Sep. 6, 2017 and is a Continuation Application of PCT Application No. PCT/JP2018/030842 filed on Aug. 21, 2018. The entire contents of each application are hereby incorporated herein by reference.

BACKGROUND OF THE INVENTION

1. Field of the Invention

The present invention relates to a displacement detector device, and more particularly, to a displacement detector device that detects a displacement of a magnet by using multiple magnetic sensors.

2. Description of the Related Art

Examples of the related art documents that disclose the configurations of displacement detector devices are Japanese Unexamined Patent Application Publication No. 2014-145714, Japanese Unexamined Patent Application Publication No. 2002-22403, and Japanese Unexamined Patent Application Publication No. 2002-277308.

A liquid-surface-level detector device disclosed in Japanese Unexamined Patent Application Publication No. 2014-145714 includes a magnet and multiple magnetic sensors. The magnet moves up and down in accordance with the surface level of a liquid stored in a tank. The multiple magnetic sensors are sequentially arranged in the top-bottom direction with a space therebetween.

In a displacement detector disclosed in Japanese Unexamined Patent Application Publication No. 2002-22403, plural Hall effect elements are disposed with a space therebetween so that they become parallel with a path of a magnet.

A liquid-surface-level detector device disclosed in Japanese Unexamined Patent Application Publication No. 2002-277308 includes a float, a permanent magnet, and multiple magnetic sensors. The float moves up and down by following a liquid surface. The permanent magnet is provided in the float. The multiple magnetic sensors detect the magnetic flux density which changes in accordance with the moving position of the permanent magnet.

In the liquid-surface-level detector device disclosed in Japanese Unexamined Patent Application Publication No. 2014-145714, the issue regarding variations in the temperature characteristics of the multiple magnetic sensors is not addressed.

Japanese Unexamined Patent Application Publication No. 2002-22403 describes that detection errors caused by variations in the sensitivity of the plural Hall effect elements can be reduced by a suitable correction method. However, a specific correction method is not addressed in Japanese Unexamined Patent Application Publication No. 2002-22403.

Japanese Unexamined Patent Application Publication No. 2002-277308 discusses the temperature characteristics of the magnetic sensors, but does not describe variations in the temperature characteristics of the multiple magnetic sensors.

SUMMARY OF THE INVENTION

Preferred embodiments of the present invention provide displacement detector devices that are each able to significantly reduce or prevent detection errors caused by variations in the temperature characteristics of multiple magnetic sensors.

A displacement detector device according to a preferred embodiment of the present invention includes multiple magnetic sensors and a magnet. The magnetic sensors are provided along a first direction. The magnet is movable along the first direction. In each of the magnetic sensors, for a correlation function between a magnetic field applied from the magnet and a value of the magnetic field detected by the magnetic sensor at a first temperature, the value detected by the magnetic sensor when the magnetic field applied from the magnet is 0 is set to be a first offset value. For a correlation function between a magnetic field applied from the magnet and a value of the magnetic field detected by the magnetic sensor at a second temperature, the value detected by the magnetic sensor when the magnetic field applied from the magnet is 0 is set to be a second offset value. The second temperature is higher than the first temperature. The multiple magnetic sensors include a pair of magnetic sensors. A value of an applied magnetic field detected by one of the pair of magnetic sensors and that detected by the other one of the pair of magnetic sensors are opposite in polarity. One of the pair of magnetic sensors is a first magnetic sensor, while the other one of the pair of magnetic sensors is a second magnetic sensor. A value calculated by subtracting the first offset value from the second offset value is positive in the first magnetic sensor and is negative in the second magnetic sensor.

In a preferred embodiment of the present invention, the multiple magnetic sensors are arranged linearly.

In a preferred embodiment of the invention, the displacement detector device further includes a movable member. The magnet is provided in the movable member.

In a preferred embodiment of the invention, the first and second magnetic sensors are alternately arranged in the first direction.

In a preferred embodiment of the invention, the displacement detector device further includes a controller that detects a displacement of the magnet in the first direction according to detection results of the pair of magnetic sensors.

In a preferred embodiment of the invention, each of the values detected by the magnetic sensors is a voltage value output from a corresponding magnetic sensor.

In a preferred embodiment of the invention, in the magnetic sensor, when the applied magnetic field is 0, a position of the magnetic sensor in the first direction is the same or substantially the same as a position of the magnet in the first direction.

In a preferred embodiment of the invention, the magnet is located at a position between the pair of magnetic sensors in the first direction.

In a preferred embodiment of the invention, the magnet moves up and down by following a liquid surface. The liquid surface is located at a position between the pair of magnetic sensors in the first direction.

According to preferred embodiments of the present invention, it is possible to significantly reduce or prevent detection errors of a displacement detector device caused by variations in the temperature characteristics of multiple magnetic sensors.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
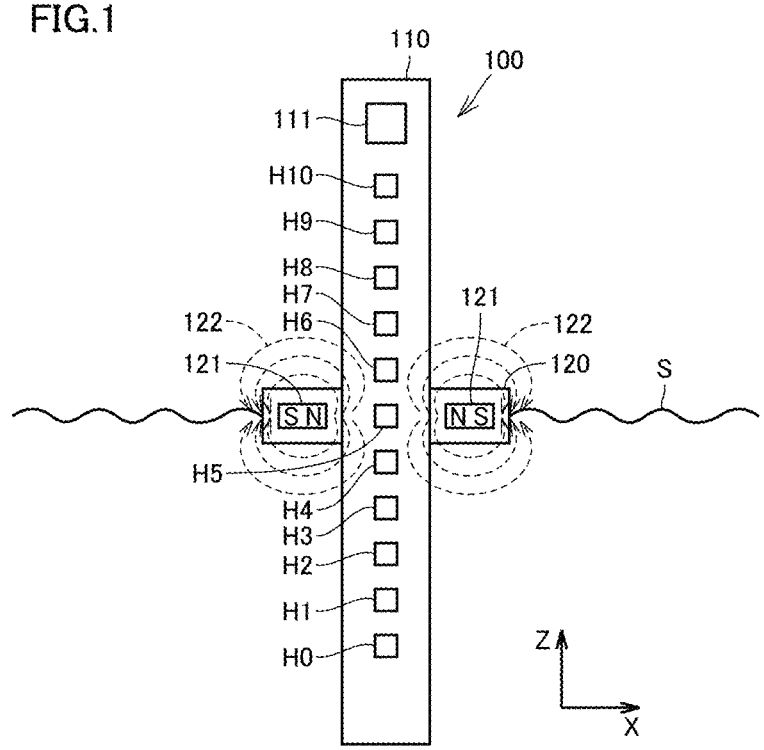
FIG. 1 is a sectional view showing a displacement detector device according to a preferred embodiment of the present invention.

Displacement detector device according to preferred embodiments of the present invention will be described below with reference to the drawings. In the following description of preferred embodiments, the same element or associated elements shown in the drawings are designated by the same reference numeral, and an explanation thereof will not be repeated. In the preferred embodiments, displacement detector devices are each used as a liquid level gauge, but it is not restricted thereto and may be used as a detector device that detects the position of a cylinder in a machine tool.

FIG. 1 is a sectional view showing a displacement detector device according to a preferred embodiment of the present invention. As shown in FIG. 1, a displacement detector device 100 according to a preferred embodiment of the present invention includes a substrate 110, multiple magnetic sensors H0 through H10, a magnet 121, and a controller 111. The Z-axis direction is a first direction, and the X-axis direction is a second direction.

The substrate 110 preferably has a rectangular or substantially rectangular external shape and has a length along the vertical direction (Z-axis direction) and a width along the horizontal direction (X-axis direction). On a first surface of the substrate 110, the magnetic sensors H0 through H10 and the controller 111 are arranged in the Z-axis direction.

The magnetic sensors H0, H1, H2, H3, H4, H5, H6, H7, H8, H9, and H10 are linearly arranged from the bottom to the top in this order. The controller 111 is located above the magnetic sensor H10. The magnetic sensors H0 through H10 are each electrically connected to the controller 111 and output a voltage value. The controller 111 detects the voltage value output from each of the magnetic sensors H0 through H10.

Each of the magnetic sensors H0 through H10 detects a magnetic field in the Z-axis direction. The magnetic sensors H0 through H10 each preferably include a Wheatstone bridge circuit defined by four AMR (Anisotropic Magneto Resistance) elements, for example. The AMR elements are magnetoresistance elements. Instead of AMR elements, each of the magnetic sensors H0 through H10 may include another type of magnetoresistance element, for example, as GMR (Giant Magneto Resistance) elements, TMR (Tunnel Magneto Resistance) elements, BMR (Ballistic Magneto Resistance) elements, and CMR (Colossal Magneto Resistance) elements.

The magnetic sensors H0 through H10 may each preferably include, for example, a half bridge circuit defined by two magnetoresistance elements. Alternatively, as each of the magnetic sensors H0 through H10, a magnetic sensor having Hall effect elements, a magnetic sensor having MI (Magneto Impedance) elements using the magneto-impedance effect, or a fluxgate magnetic sensor may be provided, for example.

The substrate 110 is stored in a cylindrical housing, which is not shown. A liquid is stored around the housing. The height of the surface S of this liquid changes. The displacement detector device according to the present preferred embodiment of the present invention detects the height of the liquid surface S. The housing extends in the Z-axis direction so that a portion of the housing is located under the liquid surface S to be measured and a portion of the housing is located above the liquid surface S.

A float 120 preferably has a cylindrical external shape. A hole of the float 120 is fit around the housing. The float 120 is a movable member moving up and down along the housing as a result of following the liquid surface S. The magnetic sensors H0 through H10 are positioned within a range by which the float 120 is movable.

The magnet 121 is provided integrally in the float 120. An exterior of the magnet 121 has a ring shape, and the magnet 121 is stored within the float 120. The magnet 121 is movable up and down, together with the movement of the float 120, along the Z-axis direction in which the magnetic sensors H0 through H10 are arranged. The magnet 121 provides a magnetic field 122 around the magnet 121 in a direction from inwards to outwards of the magnet 121.

The magnet 121 may include a sintered magnet, a bonded magnet, or a thin film, for example. The magnet 121 is not restricted to a particular type, and may be a ferrite magnet, a samarium-cobalt magnet, an alnico magnet, or a neodymium magnet, for example. The displacement detector device according to a preferred embodiment of the present invention detects the displacement of the magnet 121 in the Z-axis direction according to the height of the liquid surface S as measured by the magnetic sensors H0 through H10.

Figure 2:
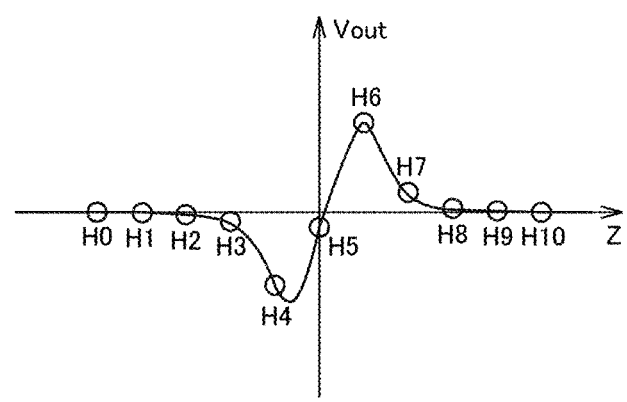
FIG. 2 is a graph showing the detection values of magnetic sensors included in a displacement detector device according to a preferred embodiment of the present invention.

FIG. 2 is a graph showing the detection values of the magnetic sensors included in the displacement detector device according to a preferred embodiment of the present invention. In FIG. 2, the vertical axis indicates the detection values (Vout) of the individual magnetic sensors H0 through H10, while the horizontal axis indicates the position of the magnetic sensors H0 through H10 in the Z-axis direction. The position in the Z-axis direction is assumed to be the height.

As shown in FIGS. 1 and 2, when the height of the liquid surface S is the same or substantially the same as that of the magnetic sensor H5, the detection value of the magnetic sensor H5 is almost 0. The detection value of the magnetic sensor H4 and that of the magnetic sensor H6 are opposite in polarity. That is, the value of the magnetic field 122 provided by the magnet 121, namely, the value of the magnetic field 122 applied from the magnet 121, detected by the magnetic sensor H4 in a magnetic-field detecting direction and that detected by the magnetic sensor H6 are opposite in polarity. The magnetic-field detecting direction is the Z-axis direction.

In this case, the magnetic sensor H4 is located below the liquid surface S, while the magnetic sensor H6 is located above the liquid surface S. As described above, the value of the magnetic field 122, which is a magnetic field applied from the magnet 121, detected by the magnetic sensor H4 in the Z-axis direction, which is the magnetic-field detecting direction, and that detected by the magnetic sensor H6 are opposite in polarity. One of the magnetic sensors H4 and H6 is positioned below the liquid surface S and the other is positioned above the liquid surface S.

An approach to estimating the height of a liquid surface by conducting linear approximation between the detection values of two magnetic sensors and the heights of these magnetic sensors will be discussed below. The values of the magnetic field 122, which is a magnetic field applied from the magnet 121, detected by these two magnetic sensors in the Z-axis direction, which is the magnetic-field detecting direction, are opposite in polarity. However, an algorithm that estimates the height of a liquid surface from the relationship between the detection values of the two magnetic sensors and their heights is not limited to linear approximation, and various known algorithms may be used. Additionally, the height of a liquid surface may be estimated from the relationships among the detection values of three or more magnetic sensors and the heights of these three or more magnetic sensors.

Figure 3:
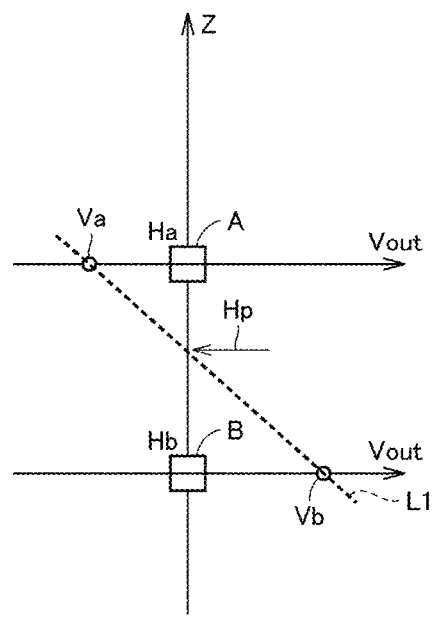
FIG. 3 is a graph showing an approach to estimating the height of a liquid surface by conducting linear approximation on the relationship between the values of a magnetic field applied from a magnet and detected by two magnetic sensors and the heights of the two magnetic sensors, the values of the magnetic field detected by the two magnetic sensors being opposite in polarity.

FIG. 3 is a graph showing an approach to estimating the height of a liquid surface by conducting linear approximation on the relationship between the detection values of the above-described two magnetic sensors and their heights. In FIG. 3, the vertical axis indicates the positions of magnetic sensors A and B in the Z-axis direction, while the horizontal axis indicates the detection values (Vout) of the magnetic sensors A and B.

As shown in FIG. 3, the relationship between the detection values of the magnetic sensors A and B and the heights of the magnetic sensors A and B is approximated by a straight line L1 which satisfies equation (1) to determine the height Hp of the liquid surface S. In equation (1), Va is the detection value of the magnetic sensor A, Ha is the height of the magnetic sensor A, Vb is the detection value of the magnetic sensor B, and Hb is the height of the magnetic sensor B. The detection value Va is a negative value, while the detection value Vb is a positive value.

$$Hp = Ha - Va \times (Hb - Ha)/(Vb - Va) \qquad (1)$$

By applying the above-described approach, the controller 111 detects the displacement of the magnet 121 in the Z-axis direction in which the magnetic sensors H0 through H10 are arranged. The controller 111 detects the displacement of the magnet 121 from the detection results of, among the magnetic sensors H0 through H10, two magnetic sensors whose detection values of the magnetic field 122 are opposite in polarity. That is, if the values of the magnetic field applied from the magnet 121 and detected by the magnetic sensors A and B in the Z-axis direction, which is the magnetic-field detecting direction, are opposite in polarity, it means that the magnet 121 is located at a height between the magnetic sensors A and B. The controller 111 is thus able to detect the displacement of the magnet 121 from the voltage values output from the magnetic sensors A and B.

The temperature characteristics of the magnetic sensors will be discussed below.

Figure 4:
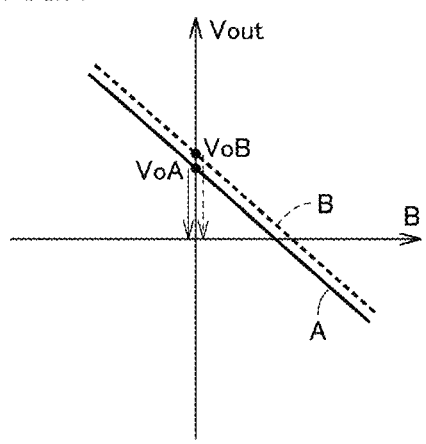
FIG. 4 is a graph showing correlation functions between a magnetic field applied from a magnet and the values of the applied magnetic field detected by two magnetic sensors at a first temperature, the values detected by the two magnetic sensors being opposite in polarity.

FIG. 4 is a graph showing correlation functions between a magnetic field applied from a magnet and the detection values of two magnetic sensors at a first temperature. The values of the magnetic field detected by the two magnetic sensors are opposite in polarity. The applied magnetic field is a magnetic field in the magnetic-field detecting direction. In FIG. 4, the vertical axis indicates the detection value (Vout) of each of magnetic sensors A and B, while the horizontal axis indicates the applied magnetic field (B) in the magnetic-field detecting direction. In FIG. 4, the correlation function of the magnetic sensor A is indicated by the solid line, and that of the magnetic sensor B is indicated by the dotted line. In FIG. 4, the first temperature is about 25° C.

FIG. 4 shows that the straight line representing the correlation function of the magnetic sensor A and that of the magnetic sensor B at the first temperature are parallel or substantially parallel with each other. When the applied magnetic field in the magnetic-field detecting direction is 0, the detection value of the magnetic sensor A is VoA, while that of the magnetic sensor B is VoB. Accordingly, plural magnetic sensors each have a unique value when the applied magnetic field in the magnetic-field detecting direction at the first temperature is 0.

Thus, in each of the magnetic sensors, zero-point adjustment is made so that the correlation function between the applied magnetic field in the magnetic-field detecting direction and the detection value at the first temperature passes through the zero point. To make this zero-point adjustment, a first offset value is set in each of the multiple magnetic sensors. The first offset value of the magnetic sensor A is VoA, and that of the magnetic sensor B is VoB.

A magnetic sensor in which zero-point adjustment is made on the correlation function at the first temperature is placed in an environment of a second temperature, which is higher than the first temperature. In this case, the slope of the correlation function between the applied magnetic field and the detection value typically changes due to the temperature characteristics of a magnetic material forming the magnetic sensor.

Figure 5:
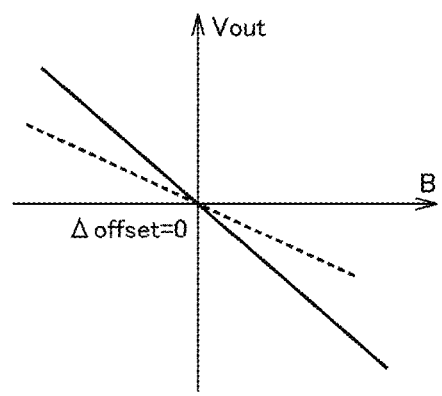
FIG. 5 is a graph showing a correlation function between an applied magnetic field in a magnetic-field detecting direction and the value of the applied magnetic field detected by a magnetic sensor at a first temperature and that at a second temperature, zero-point adjustment having been made on the correlation function at the first temperature in the magnetic sensor.

FIG. 5 is a graph showing a correlation function between an applied magnetic field in a magnetic-field detecting direction and the value of the applied magnetic field detected by a magnetic sensor at a first temperature and that at a second temperature. In the magnetic sensor, zero-point adjustment has been made on the correlation function at the first temperature. In FIG. 5, the vertical axis indicates the detection value (Vout) of the magnetic sensor, while the horizontal axis indicates the applied magnetic field (B) in the magnetic-field detecting direction. In FIG. 5, the correlation function of the magnetic sensor at the first temperature is indicated by the solid line, while that at the second temperature is indicated by the dotted line. In FIG. 5, the first temperature is about 25° C., while the second temperature is about 125° C.

As shown in FIG. 5, the slope of the straight line representing the correlation function of the magnetic sensor at the second temperature is gentler than that at the first temperature. That is, the magnetic sensor becomes less sensitive at the second temperature than at the first temperature.

In the example in FIG. 5, the above-described correlation function at the second temperature passes through the zero point. At the second temperature, when the applied magnetic field in the magnetic-field detecting direction is 0, the detection value of the magnetic sensor is 0. If a second offset value is set for the magnetic sensor to make zero-point adjustment so that the correlation function at the second temperature passes through the zero point, the second offset value becomes the same value as the first offset value. That is, the value (Δoffset) calculated by subtracting the first offset value from the second offset value is 0.

As will be discussed later, it is difficult for the second offset value to coincide with the first offset value in all multiple magnetic sensors. The magnetic sensors H0 through H10 include the following first and second magnetic sensors. In the first magnetic sensor, the value (Δoffset) calculated by subtracting the first offset value from the second offset value is positive. In the second magnetic sensor, the value (Δoffset) calculated by subtracting the first offset value from the second offset value is negative.

Figure 6:
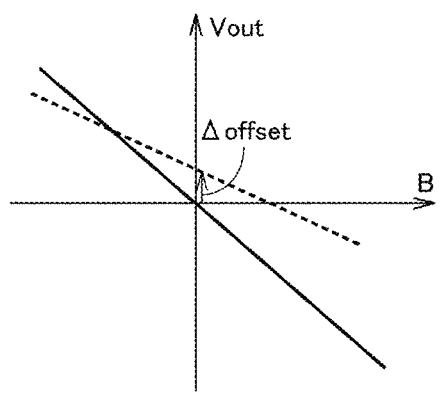
FIG. 6 is a graph showing a correlation function between an applied magnetic field in a magnetic-field detecting direction and the value of the applied magnetic field detected by a first magnetic sensor at a first temperature and that at a second temperature, zero-point adjustment having been made on the correlation function at the first temperature in the first magnetic sensor.

FIG. 6 is a graph showing a correlation function between an applied magnetic field in a magnetic-field detecting direction and the value of the applied magnetic field detected by the first magnetic sensor at a first temperature and that at a second temperature. In the first magnetic sensor, zero-point adjustment has been made on the correlation function at the first temperature. In FIG. 6, the vertical axis indicates the detection value (Vout) of the first magnetic sensor, while the horizontal axis indicates the applied magnetic field (B) in the magnetic-field detecting direction. In FIG. 6, the correlation function of the first magnetic sensor at the first temperature is indicated by the solid line, while that at the second temperature is indicated by the dotted line.

Figure 7:
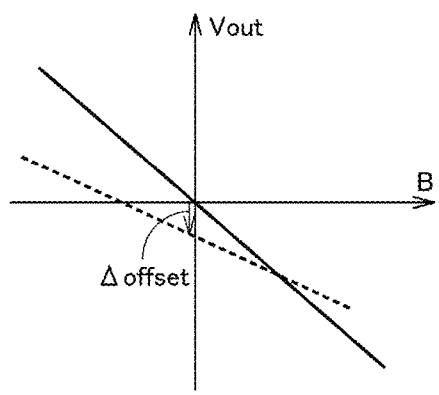
FIG. 7 is a graph showing a correlation function between an applied magnetic field in a magnetic-field detecting direction and the value of the applied magnetic field detected by a second magnetic sensor at a first temperature and that at a second temperature, zero-point adjustment having been made on the correlation function at the first temperature in the second magnetic sensor.

FIG. 7 is a graph showing a correlation function between an applied magnetic field in a magnetic-field detecting direction and the value of the applied magnetic field detected by the second magnetic sensor at a first temperature and that at a second temperature. In the second magnetic sensor, zero-point adjustment has been made on the correlation function at the first temperature. In FIG. 7, the vertical axis indicates the detection value (Vout) of the second magnetic sensor, while the horizontal axis indicates the applied magnetic field (B) in the magnetic-field detecting direction. In FIG. 7, the correlation function of the second magnetic sensor at the first temperature is indicated by the solid line, while that at the second temperature is indicated by the dotted line.

As shown in FIG. 6, as well as in FIG. 5, the slope of the straight line representing the correlation function of the first magnetic sensor at the second temperature is gentler than that at the first temperature. That is, the first magnetic sensor becomes less sensitive at the second temperature than at the first temperature.

In the first magnetic sensor, the value (Δoffset) calculated by subtracting the first offset value from the second offset value is positive, and zero-point adjustment has been made on the above-described correlation function at the first temperature. In the first magnetic sensor, when the applied magnetic field in the magnetic-field detecting direction at the second temperature is 0, the detection value is Δoffset.

As shown in FIG. 7, as well as in FIG. 5, the slope of the straight line representing the correlation function of the second magnetic sensor at the second temperature is gentler than that at the first temperature. That is, the second magnetic sensor becomes less sensitive at the second temperature than at the first temperature.

In the second magnetic sensor, the value (Δoffset) calculated by subtracting the first offset value from the second offset value is negative, and zero-point adjustment has been made on the above-described correlation function at the first temperature. In the second magnetic sensor, when the applied magnetic field in the magnetic-field detecting direction at the second temperature is 0, the detection value is Δoffset.

The reason why the above-described value (Δoffset) is varied among multiple magnetic sensors will be explained with reference to an example.

Figure 8:
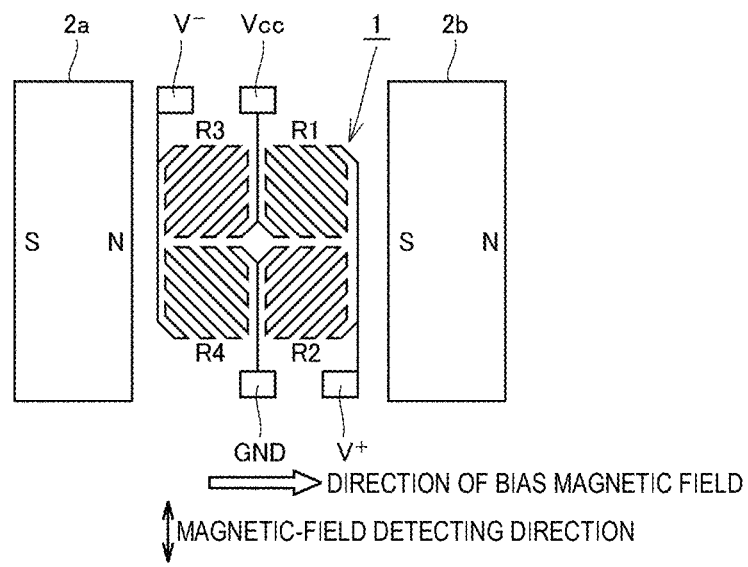
FIG. 8 is a plan view showing each of multiple magnetic sensors included in a displacement detector device according to a preferred embodiment of the present invention.

FIG. 8 is a plan view showing each of the multiple magnetic sensors included in the displacement detector device according to a preferred embodiment of the present invention. As shown in FIG. 8, in the present preferred embodiment, the magnetic sensors H0 through H10 each include first through fourth AMR elements R1 through R4 defining a Wheatstone bridge circuit 1.

This magnetic sensor will be discussed more specifically. A series-connected unit of the first and second AMR elements R1 and R2 and a series-connected unit of the third and fourth AMR elements R3 and R4 are electrically connected in parallel with each other between a power supply terminal Vcc and a ground terminal GND. A first output terminal V$^+$ is electrically connected to a node between the first and second AMR elements R1 and R2. A second output terminal V$^-$ is electrically connected to a node between the third and fourth AMR elements R3 and R4. Accordingly, a drive voltage (Vdd) is applicable to the bridge circuit 1.

Each of the first through fourth AMR elements R1 through R4 includes a magnetic pattern having a meandering shape so that current paths of certain AMR elements become parallel or substantially parallel with each other in the longitudinal direction. The first and fourth AMR elements R1 and R4 are provided so that their current paths become parallel or substantially parallel with each other in the longitudinal direction. The second and third AMR elements R2 and R3 are provided so that their current paths become parallel or substantially parallel with each other in the longitudinal direction. The current paths of the second and third AMR elements R2 and R3 are perpendicular or substantially perpendicular to those of the first and fourth AMR elements R1 and R4 in the longitudinal direction.

The magnetic patterns of the first through fourth AMR elements R1 through R4 are formed by making a permalloy thin film into a pattern, for example.

First and second bias magnets 2a and 2b are provided with a space therebetween to sandwich the bridge circuit 1 located therebetween. The first and second bias magnets 2a and 2b each preferably have a quadrangular prism shape. The N pole of the first bias magnet 2a and the S pole of the second bias magnet 2b oppose each other. Conversely, the S pole of the first bias magnet 2a and the N pole of the second bias magnet 2b may oppose each other.

As the material for each of the first and second bias magnets 2a and 2b, isotropic ferrite, anisotropic ferrite, samarium-cobalt, alnico, or neodymium, for example, may preferably be used. Each of the first and second bias magnets 2a and 2b may include a sintered magnet, a bonded magnet, or a thin film, for example.

The direction of a bias magnetic field generated between the first and second bias magnets 2a and 2b intersects at about 45° with the longitudinal direction of the current path of each of the first through fourth AMR elements R1 through R4. The direction of the bias magnetic field generated between the first and second bias magnets 2a and 2b is perpendicular or substantially perpendicular to the magnetic-field detecting direction of the first through fourth AMR elements R1 through R4. The magnetic-field detecting direction is the Z-axis direction.

Figure 9:
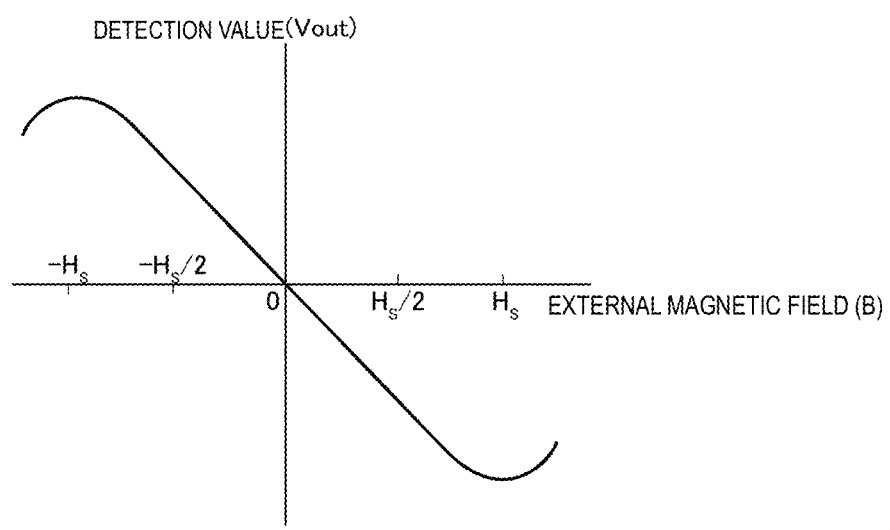
FIG. 9 is a graph showing the relationship between the strength of an external magnetic field and output of each of multiple magnetic sensors included in a displacement detector device according to a preferred embodiment of the present invention.

FIG. 9 is a graph showing the relationship between the strength of an external magnetic field and output of each of the multiple magnetic sensors included in the displacement detector device according to a preferred embodiment of the present invention. In FIG. 9, the vertical axis indicates the detection value (Vout) of the magnetic sensor, while the horizontal axis indicates the strength of the external magnetic field (B). The detection value (Vout) of the magnetic sensor is the voltage value output from the magnetic sensor, for example.

In a state in which a bias magnetic field, which intersects at about 45° with the longitudinal directions of the current paths of the first through fourth AMR elements R1 through R4, is applied as shown in FIG. 8, the magnetic sensor outputs the detection value (Vout) proportional to the strength of the external magnetic field (B), as shown in FIG. 9.

If, however, the positional relationship between the first through fourth AMR elements R1 through R4 and the first and second bias magnets 2a and 2b is disturbed, the intersecting angle of the bias magnetic field with respect to the longitudinal directions of the current paths of the first through fourth AMR elements R1 through R4 deviates from about 45°.

In this case, the slope of the straight line representing the proportional relationship between the strength of the external magnetic field (B) and the detection value (Vout) of the magnetic sensor shown in FIG. 9 is changed and also does not pass through the zero point. This causes variations in each of the first and second offset values among magnetic sensors.

In the example shown in FIG. 6, the intersecting angle of the bias magnetic field with respect to the longitudinal directions of the current paths of the first through fourth AMR elements R1 through R4 is about 47°, for example. In the example shown in FIG. 7, the intersecting angle of the bias magnetic field with respect to the longitudinal directions of the current paths of the first through fourth AMR elements R1 through R4 is about 43°, for example.

If the multiple magnetic sensors are defined by GMR elements or TMR elements, each of the first and second offset values is varied due to variations in the magnetization direction of the pinned layer and that of the free layer among the GMR or TMR elements.

It is now assumed that the second offset value is the same or substantially the same value as the first offset value in each of two magnetic sensors. The values of an applied magnetic field in a magnetic-field detecting direction detected by the two magnetic sensors are opposite in polarity. The relationship between the estimated height of a liquid surface at a first temperature and that at a second temperature will be explained below.

Figure 10:
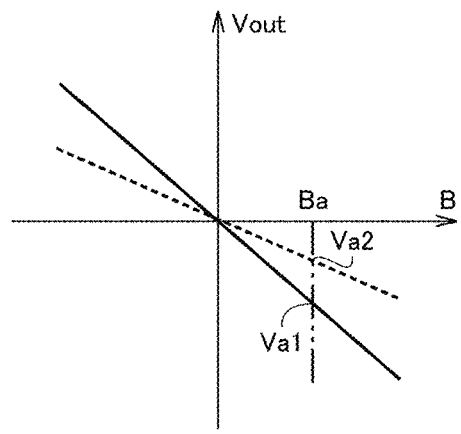
FIG. 10 is a graph showing a correlation function at a first temperature and that at a second temperature in one of two magnetic sensors having $\Delta \text{offset}=0$, the values of an applied magnetic field in a magnetic-field detecting direction detected by the two magnetic sensors being opposite in polarity.

FIG. 10 is a graph showing a correlation function at the first temperature and that at the second temperature in one of the above-described two magnetic sensors having Δoffset=0. In FIG. 10, the vertical axis indicates the detection value (Vout) of a magnetic sensor A, while the horizontal axis indicates the applied magnetic field (B) in the magnetic-field detecting direction. In FIG. 10, the correlation function of the magnetic sensor A at the first temperature is indicated by the solid line, while that at the second temperature is indicated by the dotted line, and the strength of the magnetic field 122 applied from the magnet 121 to the magnetic sensor A is indicated by the long dashed double-dotted line.

Figure 11:
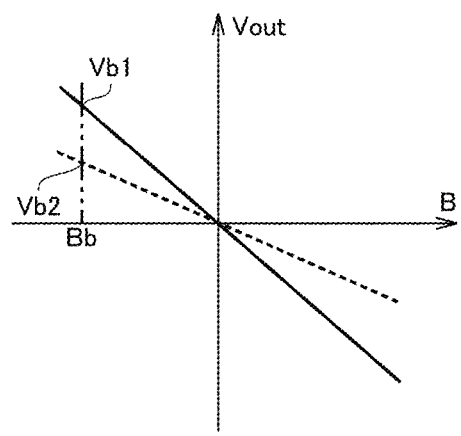
FIG. 11 is a graph showing a correlation function at the first temperature and that at the second temperature in the other one of the two magnetic sensors having $\Delta \text{offset}=0$.

FIG. 11 is a graph showing a correlation function at the first temperature and that at the second temperature in the other one of the above-described two magnetic sensors having Δoffset=0. In FIG. 11, the vertical axis indicates the detection value (Vout) of a magnetic sensor B, while the horizontal axis indicates the applied magnetic field (B) in the magnetic-field detecting direction. In FIG. 11, the correlation function of the magnetic sensor B at the first temperature is indicated by the solid line, while that at the second temperature is indicated by the dotted line, and the strength of the magnetic field 122 applied from the magnet 121 to the magnetic sensor B is indicated by the long dashed double-dotted line.

Figure 12:
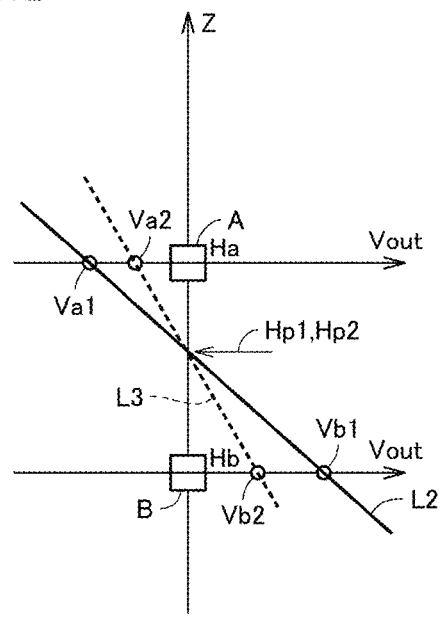
FIG. 12 is a graph showing the height of a liquid surface at the first temperature and that at the second temperature, the heights of the liquid surface being estimated by conducting linear approximation on the relationships between the detection values of the two magnetic sensors and the heights of the magnetic sensors.

FIG. 12 is a graph showing the height of a liquid surface at the first temperature and that at the second temperature. The heights of the liquid surface are estimated by conducting linear approximation on the relationships between the detection values of the above-described two magnetic sensors and the heights of the magnetic sensors. In FIG. 12, the vertical axis indicates the positions of the two magnetic sensors in the Z-axis direction, while the horizontal axis indicates the detection values (Vout) of the two magnetic sensors. The position in the Z-axis direction is assumed to be the height.

As shown in FIGS. 10 and 12, the strength of the magnetic field 122 applied from the magnet 121 to the magnetic sensor A is Ba, and the detection value of the magnetic sensor A at the first temperature is Va1, while that at the second temperature is Va2.

As shown in FIGS. 11 and 12, the strength of the magnetic field 122 applied from the magnet 121 to the magnetic sensor B is Bb, and the detection value of the magnetic sensor B at the first temperature is Vb1, while that at the second temperature is Vb2.

As shown in FIG. 12, the detection value of the magnetic sensor A at the first temperature is Va1, the height of the magnetic sensor A is Ha, the detection value of the magnetic sensor B at the first temperature is Vb1, and the height of the magnetic sensor B is Hb. Then, the relationship between the detection values of these two magnetic sensors and the heights of the magnetic sensors is approximated by a straight line L2 to determine the height Hp1 of the liquid surface S at the first temperature. Likewise, the detection value of the magnetic sensor A at the second temperature is Va2, the height of the magnetic sensor A is Ha, the detection value of the magnetic sensor B at the second temperature is Vb2, and the height of the magnetic sensor B is Hb. Then, the relationship between the detection values of these two magnetic sensors and the heights of the magnetic sensors is approximated by a straight line L3 to determine the height Hp2 of the liquid surface S at the second temperature.

When Δoffset=0 in each of the magnetic sensors A and B, the estimated height Hp1 of the liquid surface S at the first temperature and the estimated height Hp2 of the liquid surface S at the second temperature are equal or substantially equal to each other. That is, the value of the liquid surface estimated according to two magnetic sensors whose detection values of an applied magnetic field in a magnetic-field detecting direction are opposite in polarity is not influenced by a temperature change. It is however difficult to set Δoffset=0 in all multiple magnetic sensors. In most of the magnetic sensors, Δoffset ≠0.

It is now assumed that two magnetic sensors whose detection values of an applied magnetic field in a magnetic-field detecting direction are opposite in polarity are the first magnetic sensors having Δoffset>0. The relationship between the estimated height of a liquid surface at the first temperature and that at the second temperature will be explained below.

Figure 13:
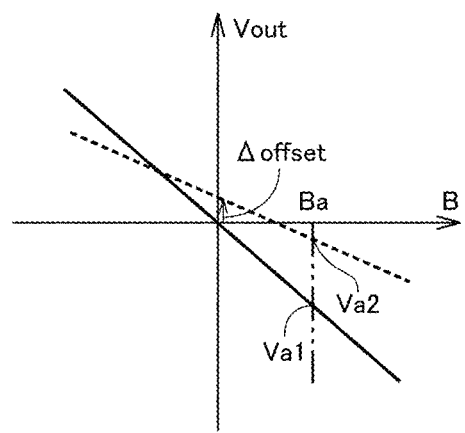
FIG. 13 is a graph showing a correlation function at a first temperature and that at a second temperature in one of two first magnetic sensors having $\Delta \text{offset}>0$, the values of an applied magnetic field in a magnetic-field detecting direction detected by the two first magnetic sensors being opposite in polarity.

FIG. 13 is a graph showing a correlation function at the first temperature and that at the second temperature in one of the above-described two first magnetic sensors having Δoffset>0. In FIG. 13, the vertical axis indicates the detection value (Vout) of a magnetic sensor A, while the horizontal axis indicates the applied magnetic field (B) in the magnetic-field detecting direction. In FIG. 13, the correlation function of the magnetic sensor A at the first temperature is indicated by the solid line, while that at the second temperature is indicated by the dotted line, and the strength of the magnetic field 122 applied from the magnet 121 to the magnetic sensor A is indicated by the long dashed double-dotted line.

Figure 14:
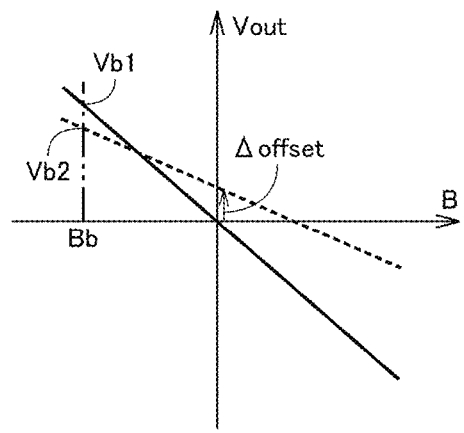
FIG. 14 is a graph showing a correlation function at the first temperature and that at the second temperature in the other one of the two first magnetic sensors having $\Delta \text{offset}>0$.

FIG. 14 is a graph showing a correlation function at the first temperature and that at the second temperature in the other one of the above-described two first magnetic sensors having Δoffset>0. In FIG. 14, the vertical axis indicates the detection value (Vout) of a magnetic sensor B, while the horizontal axis indicates the applied magnetic field (B) in the magnetic-field detecting direction. In FIG. 14, the correlation function of the magnetic sensor B at the first temperature is indicated by the solid line, while that at the second temperature is indicated by the dotted line, and the strength of the magnetic field 122 applied from the magnet 121 to the magnetic sensor B is indicated by the long dashed double-dotted line.

Figure 15:
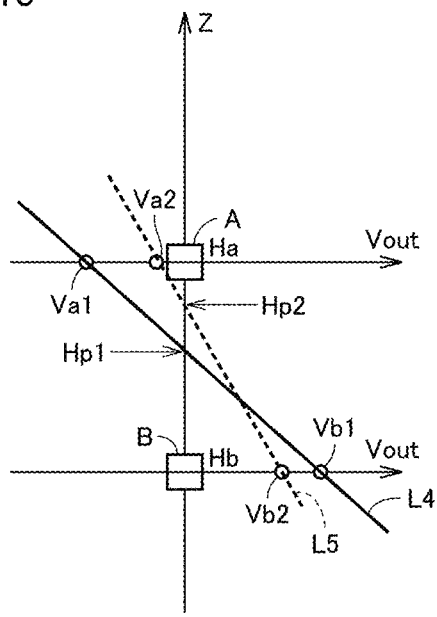
FIG. 15 is a graph showing the height of a liquid surface at the first temperature and that at the second temperature, the heights of the liquid surface being estimated by conducting linear approximation on the relationships between the detection values of the two first magnetic sensors and the heights of the first magnetic sensors.

FIG. 15 is a graph showing the height of a liquid surface at the first temperature and that at the second temperature. The heights of the liquid surface are estimated by conducting linear approximation on the relationships between the detection values of the two first magnetic sensors and the heights of the first magnetic sensors. In FIG. 15, the vertical axis indicates the positions of the two first magnetic sensors in the Z-axis direction, while the horizontal axis indicates the detection values (Vout) of the two first magnetic sensors.

As shown in FIGS. 13 and 15, the strength of the magnetic field 122 applied from the magnet 121 to the magnetic sensor A is Ba, and the detection value of the magnetic sensor A at the first temperature is Va1, while that at the second temperature is Va2.

As shown in FIGS. 14 and 15, the strength of the magnetic field 122 applied from the magnet 121 to the magnetic sensor B is Bb, and the detection value of the magnetic sensor B at the first temperature is Vb1, while that at the second temperature is Vb2.

As shown in FIG. 15, the detection value of the magnetic sensor A at the first temperature is Va1, the height of the magnetic sensor A is Ha, the detection value of the magnetic sensor B at the first temperature is Vb1, and the height of the magnetic sensor B is Hb. Then, the relationship between the detection values of these two first magnetic sensors and the heights of the first magnetic sensors is approximated by a straight line L4 to determine the height Hp1 of the liquid surface S at the first temperature. Similarly, the detection value of the magnetic sensor A at the second temperature is Va2, the height of the magnetic sensor A is Ha, the detection value of the magnetic sensor B at the second temperature is Vb2, and the height of the magnetic sensor B is Hb. Then, the relationship between the detection values of these two first magnetic sensors and the heights of the first magnetic sensors is approximated by a straight line L5 to determine the height Hp2 of the liquid surface S at the second temperature.

When the magnetic sensors A and B are the first magnetic sensors having Δoffset>0, the estimated height Hp1 of the liquid surface S at the first temperature and the estimated height Hp2 of the liquid surface S at the second temperature are considerably different from each other. That is, the value of a liquid surface estimated according to two first magnetic sensors whose detection values of an applied magnetic field in a magnetic-field detecting direction are opposite in polarity is considerably influenced by a temperature change. This applies to when the magnetic sensors A and B are the second magnetic sensors having Δoffset<0. The value of a liquid surface estimated according to two second magnetic sensors whose detection values of an applied magnetic field in a magnetic-field detecting direction are opposite in polarity is considerably influenced by a temperature change.

It is now assumed that one of two magnetic sensors whose detection values of an applied magnetic field in a magnetic-field detecting direction are opposite in polarity is the first magnetic sensor having Δoffset>0 and the other one of the two magnetic sensors is the second magnetic sensor having Δoffset<0. The relationship between the estimated height of a liquid surface at the first temperature and that at the second temperature will be explained below.

Figure 16:
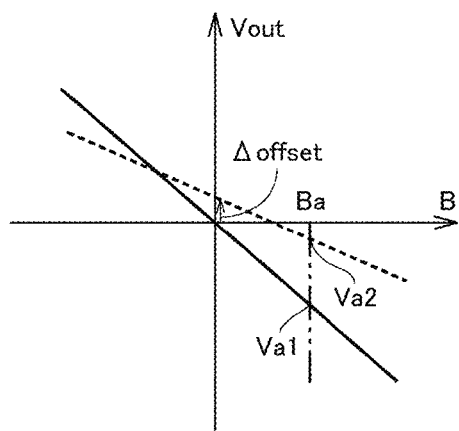
FIG. 16 is a graph showing a correlation function at a first temperature and that at a second temperature in one of two magnetic sensors, namely, a first magnetic sensor having $\Delta \text{offset}>0$, the values of an applied magnetic field in a magnetic-field detecting direction detected by the two magnetic sensors being opposite in polarity.

FIG. 16 is a graph showing a correlation function at the first temperature and that at the second temperature in one of the above-described two magnetic sensors, namely, the first magnetic sensor having Δoffset>0. In FIG. 16, the vertical axis indicates the detection value (Vout) of a magnetic sensor A, while the horizontal axis indicates the applied magnetic field (B) in the magnetic-field detecting direction. In FIG. 16, the correlation function of the magnetic sensor A at the first temperature is indicated by the solid line, while that at the second temperature is indicated by the dotted line, and the strength of the magnetic field 122 applied from the magnet 121 to the magnetic sensor A is indicated by the long dashed double-dotted line.

Figure 17:
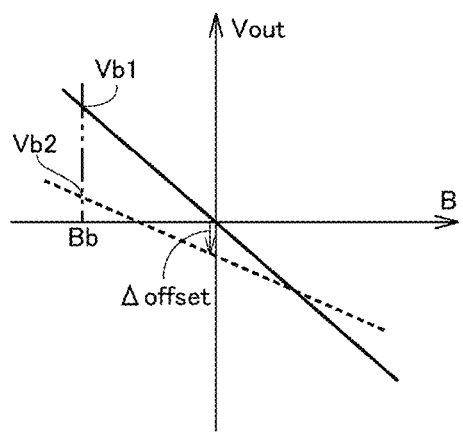
FIG. 17 is a graph showing a correlation function at the first temperature and that at the second temperature in the other one of the two magnetic sensors, namely, a second magnetic sensor having $\Delta \text{offset}<0$.

FIG. 17 is a graph showing a correlation function at the first temperature and that at the second temperature in the other one of the above-described two magnetic sensors, namely, the second magnetic sensor having Δoffset<0. In FIG. 17, the vertical axis indicates the detection value (Vout) of a magnetic sensor B, while the horizontal axis indicates the applied magnetic field (B) in the magnetic-field detecting direction. In FIG. 17, the correlation function of the magnetic sensor B at the first temperature is indicated by the solid line, while that at the second temperature is indicated by the dotted line, and the strength of the magnetic field 122 applied from the magnet 121 to the magnetic sensor B is indicated by the long dashed double-dotted line.

Figure 18:
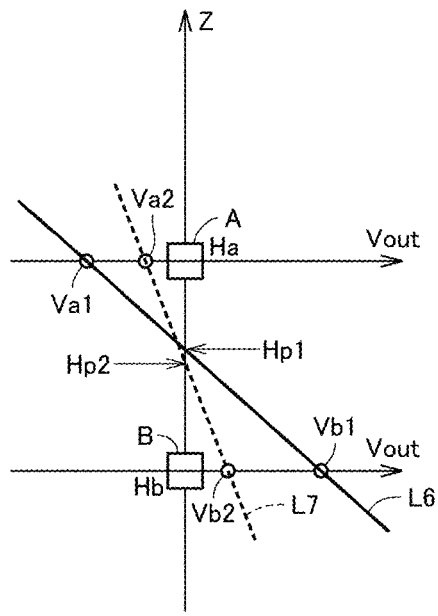
FIG. 18 is a graph showing the height of a liquid surface at the first temperature and that at the second temperature, the heights of the liquid surface being estimated by conducting linear approximation on the relationships between the detection values of the first and second magnetic sensors and the heights of the first and second magnetic sensors.

FIG. 18 is a graph showing the height of a liquid surface at the first temperature and that at the second temperature. The heights of the liquid surface are estimated by conducting linear approximation on the relationships between the detection values of the above-described first and second magnetic sensors and the heights of the first and second magnetic sensors. In FIG. 18, the vertical axis indicates the positions of the first and second magnetic sensors in the Z-axis direction, while the horizontal axis indicates the detection values (Vout) of the first and second magnetic sensors.

As shown in FIGS. 16 and 18, the strength of the magnetic field 122 applied from the magnet 121 to the magnetic sensor A is Ba, and the detection value of the magnetic sensor A at the first temperature is Va1, while that at the second temperature is Va2.

As shown in FIGS. 17 and 18, the strength of the magnetic field 122 applied from the magnet 121 to the magnetic sensor B is Bb, and the detection value of the magnetic sensor B at the first temperature is Vb1, while that at the second temperature is Vb2.

As shown in FIG. 18, the detection value of the magnetic sensor A at the first temperature is Va1, the height of the magnetic sensor A is Ha, the detection value of the magnetic sensor B at the first temperature is Vb1, and the height of the magnetic sensor B is Hb. Then, the relationship between the detection values of the first and second magnetic sensors and the heights of the first and second magnetic sensors is approximated by a straight line L6 to determine the height Hp1 of the liquid surface S at the first temperature. Likewise, the detection value of the magnetic sensor A at the second temperature is Va2, the height of the magnetic sensor A is Ha, the detection value of the magnetic sensor B at the second temperature is Vb2, and the height of the magnetic sensor B is Hb. Then, the relationship between the detection values of the first and second magnetic sensors and the heights of the first and second magnetic sensors is approximated by a straight line L7 to determine the height Hp2 of the liquid surface S at the second temperature.

When the magnetic sensor A is the first magnetic sensor having Δoffset>0 and the magnetic sensor B is the second magnetic sensor having Δoffset<0, the difference between the estimated height Hp1 of the liquid surface S at the first temperature and the estimated height Hp2 of the liquid surface S at the second temperature is smaller than that in the example in FIG. 15. That is, the value of the liquid surface estimated according to the first and second magnetic sensors whose detection values of an applied magnetic field in a magnetic-field detecting direction are opposite in polarity is less influenced by a temperature change than the value estimated according to the two first magnetic sensors.

Based on the above-described result, in the magnetic sensors H0 through H10 included in the displacement detector device 100 according to the present preferred embodiment, the first and second magnetic sensors are arranged as described below. A pair of magnetic sensors whose detection values of an applied magnetic field in a magnetic-field detecting direction are opposite in polarity is defined by the first and second magnetic sensors.

More specifically, the magnetic sensors H0, H1, H4, H5, H8, and H9 are the first magnetic sensors, while the magnetic sensors H2, H3, H6, H7, and H10 are the second magnetic sensors. Conversely, the magnetic sensors H0, H1, H4, H5, H8, and H9 may be the second magnetic sensors, while the magnetic sensors H2, H3, H6, H7, and H10 may be the first magnetic sensors.

As a result of defining the magnetic sensors H0 through H10 by the first and second magnetic sensors as described above, errors in the estimated value of the height of a liquid surface caused by a temperature change can be significantly reduced or prevented. That is, it is possible to significantly reduce or prevent detection errors of the displacement detector device 100 caused by variations in the temperature characteristics of the magnetic sensors H0 through H10. It is thus possible to regulate a decrease in the detection precision of the displacement detector device 100 caused by the temperature characteristics of the magnetic sensors H0 through H10. To regulate the decrease in the detection precision of the displacement detector device 100, it is preferable that, concerning the above-described pair of first and second magnetic sensors, the absolute value of Δoffset of the first magnetic sensor and that of the second magnetic sensor are the same or substantially the same, for example.

Figure 19:
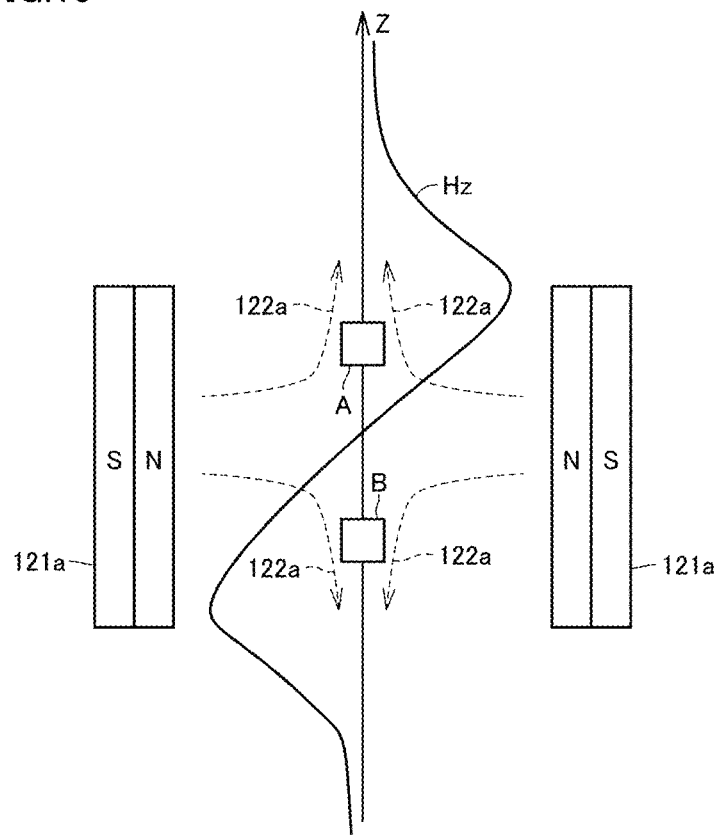
FIG. 19 is a partial plan view showing the positional relationship between magnetic sensors and magnets and a magnetic field applied to the magnetic sensors in a displacement detector device according to a modified example of a preferred embodiment of the present invention.

The arrangement of the first and second magnetic sensors is not restricted to that in the above-described example, and is suitably changed in accordance with the magnetic field 122 applied from the magnet 121. FIG. 19 is a partial plan view showing the positional relationship between magnetic sensors and magnets and a magnetic field applied to the magnetic sensors in a displacement detector device according to a modified example of a preferred embodiment of the present invention.

As shown in FIG. 19, in the displacement detector device according to this modified example, magnets 121a are elongated in the Z-axis direction, and a magnetic sensor A and a magnetic sensor B are located between the two magnets 121a. A magnetic field 122a facing one side of the Z-axis direction is mainly applied to the magnetic sensor A, while a magnetic field 122a facing the other side of the Z-axis direction is mainly applied to the magnetic sensor B. As a result, the magnetic field applied to the magnetic sensor A and that to the magnetic sensor B are opposite in polarity, as indicated by the solid line Hz.

In a case in which the magnetic sensors A and B are located adjacent to or in a vicinity of each other, the magnetic sensor A is the first magnetic sensor, while the magnetic sensor B is the second magnetic sensor. Alternatively, the magnetic sensor A is the second magnetic sensor, while the magnetic sensor B is the first magnetic sensor. In this type of arrangement, in multiple magnetic sensors, the first and second magnetic sensors are alternately provided.

In the above-described preferred embodiments, some of the features may be combined with each other within a technically possible range. Plural magnetic sensors may be provided linearly in the horizontal direction (X-axis direction) or be provided in a certain shape, for example, an arc, instead of being provided linearly in the Z-axis direction.

The disclosed preferred embodiments are provided only as examples, but are not intended to be exhaustive or to limit the present invention to the precise configurations and arrangements disclosed. It is intended that the scope of the present invention is defined, not by the foregoing preferred embodiments, but by the following claims. The scope of the present invention is to be accorded the broadest interpretation to encompass all such modifications and equivalent structures and functions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A displacement detector device comprising:
   a plurality of magnetic sensors provided along a first direction; and
   a magnet that is movable along the first direction; wherein
   in each of the plurality of magnetic sensors, for a correlation function between a magnetic field applied from the magnet and a value of the magnetic field detected by the magnetic sensor at a first temperature, the value detected by the magnetic sensor when the magnetic field applied from the magnet is 0 is set to be a first offset value; and
   in each of the plurality of magnetic sensors, for a correlation function between a magnetic field applied from the magnet and a value of the magnetic field detected by the magnetic sensor at a second temperature, the value detected by the magnetic sensor when the magnetic field applied from the magnet is 0 is set to be a second offset value;
   the second temperature is higher than the first temperature;
   the plurality of magnetic sensors include a pair of magnetic sensors including a first magnetic sensor and a second magnetic sensor;
   a value of an applied magnetic field detected by the first magnetic sensor and a value of the applied magnetic field detected by the second magnetic sensor are opposite in polarity; and
   a value calculated by subtracting the first offset value from the second offset value is positive in the first magnetic sensor and is negative in the second magnetic sensor.

2. The displacement detector device according to claim 1, wherein the plurality of magnetic sensors are arranged linearly.

3. The displacement detector device according to claim 1, further comprising:
   a movable member; wherein
   the magnet is provided in the movable member.

4. The displacement detector device according to claim 1, wherein the first and second magnetic sensors are alternately arranged in the first direction.

5. The displacement detector device according to claim 1, further comprising a controller that detects a displacement of the magnet in the first direction according to detection results of the pair of magnetic sensors.

6. The displacement detector device according to claim 1, wherein each of the values detected by the plurality of magnetic sensors is a voltage value output from a corresponding magnetic sensor.

7. The displacement detector device according to claim 1, wherein, in the magnetic sensor, when the applied magnetic field is 0, a position of the magnetic sensor in the first direction is the substantially the same as a position of the magnet in the first direction.

8. The displacement detector device according to claim 1, wherein the magnet is located at a position between the pair of magnetic sensors in the first direction.

9. The displacement detector device according to claim 1, wherein the magnet moves up and down by following a liquid surface, and the liquid surface is located at a position between the pair of magnetic sensors in the first direction.

10. The displacement detector device according to claim 1, wherein the plurality of magnetic sensors are provided on a surface of a substrate.

11. The displacement detector device according to claim 1, wherein each of the plurality of magnetic sensors detect the applied magnetic field in a z-axis direction.

12. The displacement detector device according to claim 1, wherein each of the plurality of magnetic sensors includes a Wheatstone bridge circuit including Anisotropic Magneto Resistance (AMR) elements.

13. The displacement detector device according to claim 1, wherein each of the plurality of magnetic sensors includes a half bridge circuit including two magnetoresistance elements.

14. The displacement detector device according to claim 3, wherein
   the plurality of magnetic sensors are provided in a housing; and
   the movable member is movable along the housing.

15. The displacement detector device according to claim 3, wherein the movable member is movable in a z-axis direction.

16. The displacement detector device according to claim 5, wherein the controller is arranged linearly with the plurality of magnetic sensors.

17. The displacement detector device according to claim 5, wherein the detection results of the pair of magnetic sensors are voltage values output from the pair of magnetic sensors.

* * * * *